(12) United States Patent
Oh et al.

(10) Patent No.: US 8,178,881 B2
(45) Date of Patent: May 15, 2012

(54) ARRAY SUBSTRATE FOR LIQUID CRYSTAL DISPLAY DEVICE AND FABRICATION METHOD THEREOF

(75) Inventors: Jae Young Oh, Uiwang-si (KR); Soopool Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/883,911

(22) Filed: Sep. 16, 2010

(65) Prior Publication Data

US 2011/0012120 A1    Jan. 20, 2011

Related U.S. Application Data

(62) Division of application No. 11/635,244, filed on Dec. 7, 2006, now Pat. No. 7,811,870.

(30) Foreign Application Priority Data

Feb. 15, 2006   (KR) .................. 10-2006-0014596

(51) Int. Cl.
*H01L 29/04* (2006.01)
*H01L 29/10* (2006.01)
*H01L 31/00* (2006.01)

(52) U.S. Cl. ............... 257/59; 257/72; 257/E29.273; 438/30; 438/158

(58) Field of Classification Search ............ 438/30, 438/158; 257/E29.273, 59, 72
See application file for complete search history.

(56) References Cited

U.S. PATENT DOCUMENTS

| 6,873,382 B2 * | 3/2005 | Chang et al. ............ 349/106 |
| 2006/0097260 A1 | 5/2006 | Huwang |
| 2007/0287235 A1 | 12/2007 | Lin |

* cited by examiner

*Primary Examiner* — Jarrett Stark
*Assistant Examiner* — John M Parker
(74) *Attorney, Agent, or Firm* — Brinks Hofer Gilson & Lione (57) ABSTRACT

Provided is a liquid crystal display (LCD) device and a fabrication method thereof. An array substrate for the LCD includes a gate line formed on a substrate, and a gate electrode extending from the gate line; a data line intersected with the gate line, wherein the data line is configured with a gate insulating layer, a semiconductor layer and a data metal layer; a pixel electrode formed of a first transparent metal layer at a pixel which is defined by an intersection of the gate line and the data line; a source electrode extending from the data line, and a drain electrode spaced apart from the source electrode by a predetermined distance to expose a channel; and a second transparent metal layer pattern formed on the data line, the source electrode and the drain electrode, wherein the second transparent metal layer connects the drain electrode and the pixel electrode to each other.

12 Claims, 10 Drawing Sheets

【Fig. 1】

(Related Art)

[Fig. 2]

(Related Art)

ARRAY SUBSTRATE FOR LIQUID CRYSTAL DISPLAY DEVICE AND FABRICATION METHOD THEREOF

The present patent document is a divisional of U.S. patent application Ser. No. 11/635,244, filed Dec. 7, 2006, which claims priority to Korean Patent Application No. P2006-14596 filed in Korea on Feb. 15, 2006, which are hereby incorporated by reference.

BACKGROUND

1. Field of the Invention

The present disclosure relates to a liquid crystal display (LCD) device, and more particularly, to an array substrate for an LCD device that can maximize productivity by reducing the number of mask processes, and a fabrication method thereof.

2. Discussion of the Related Art

In recent years, demand for flat panel displays having characteristics such as a thin profile, low weight, and low power consumption has rapidly increased.

Generally, an LCD includes two substrates, each of which has an electrode on one surface thereof. The substrates are disposed such that the surfaces with the electrodes face each other. The LCD displays an image by controlling the light transmission of a liquid crystal material disposed between the two substrates. The transmission is varied when a voltage is applied to the electrodes due to changes in the degree of rotation of liquid crystal molecules in the material.

Various types of LCDs can be fabricated. Active matrix LCDs (AM-LCD), in which thin film transistors (TFTs) and pixel electrodes connected to the TFTs are arranged in a matrix configuration, is popular due to its superior resolution and capability of reproducing moving pictures.

In the AM-LCD, a lower array substrate has pixel electrodes formed thereon, and an upper color filter substrate has a common electrode thereon. Therefore, as a voltage is applied to the electrodes of the array substrate and the color substrate, a vertical electric field is formed between the two substrates to rotate the liquid crystal molecules. The AM-LCD has advantages, such as superior transmittance and aperture ratio, and also prevents liquid crystal cells from failing due to static electricity because the upper common electrode serves as a ground.

The upper color substrate further includes a black matrix for preventing light leakage at a portion other than the pixel electrodes.

Meanwhile, the lower array substrate is formed by repeated processes of depositing thin films and patterning the deposited thin films by photolithography using a mask. In the patterning of the deposited thin films, five or six masks are generally used. The number of masks used generally corresponds to the number of processes used for fabricating the array substrate.

A related art array substrate for an LCD and fabrication method thereof will now be described with reference to the accompanying drawings.

Figure 1:
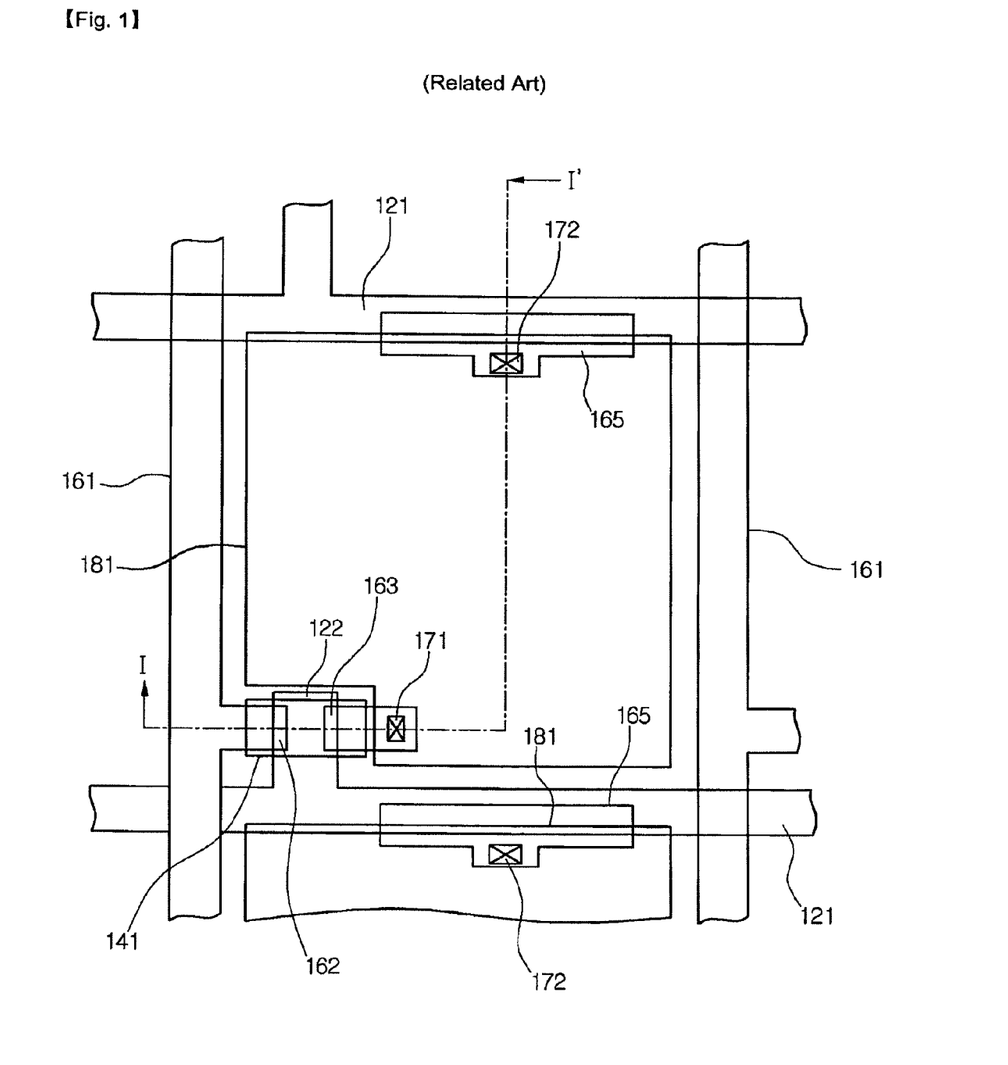
FIG. 1 is a plan view of an array substrate for a liquid crystal display (LCD) device according to a related art.
Figure 2:
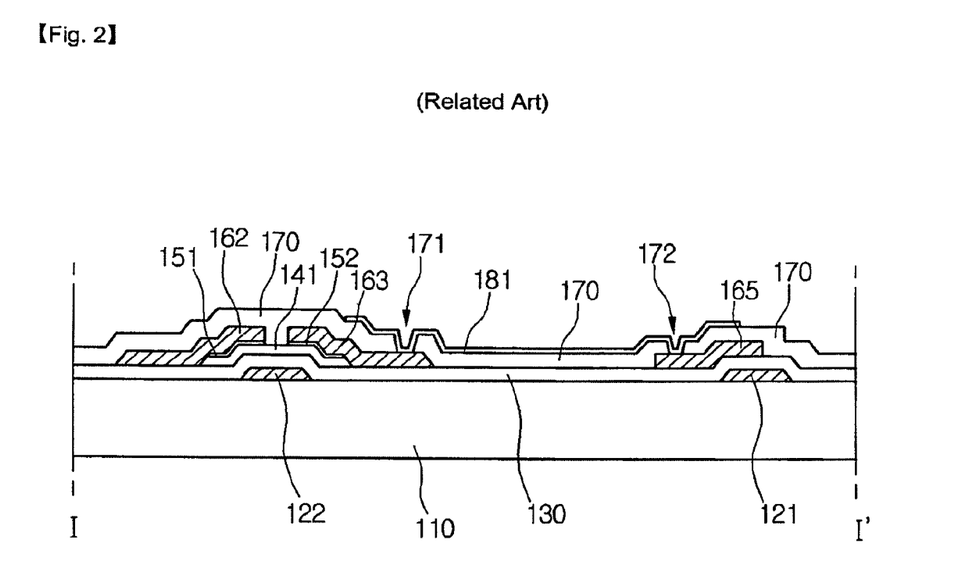
FIG. 2 is a sectional view taken along the line I-I' of FIG. 1.

FIG. 1 is a plan view of an array substrate for an LCD according to a related art, and FIG. 2 is a sectional view taken along the line I-I' of FIG. 1.

Referring to FIGS. 1 and 2, the array substrate for an LCD includes a transparent insulating substrate 110, a gate line 121 formed on the transparent insulating substrate 110 in a horizontal direction, and a gate electrode 122 extending from the gate line 121.

A gate insulator 130 is formed on the gate line 121 and the gate electrode 122, and an active layer 141 and an ohmic contact layer 151, 152 are sequentially formed on the gate insulator 130.

A data line 161 perpendicularly crossing the plurality of gate lines 121, a source electrode 162 extending from each of the data lines 161, a drain electrode 163 spaced apart from the source electrode 162 on the gate electrode 122, and a capacitor electrode 165 overlying the gate line 121 are formed on the ohmic contact layer 151, 152.

The data line 161, the source and drain electrodes 162 and 163, and the capacitor electrode 165 are covered with a passivation layer 170. The passivation layer 170 has first and second contact holes 171 and 172 exposing the drain electrode 163 and the capacitor electrode 165, respectively.

A pixel electrode 181 is formed at a pixel region on the passivation layer 170, the pixel region being defined by the gate line 121 and the data line 161 crossing the gate line 121. The pixel electrode 181 is electrically connected with the drain electrode 162 and the capacitor electrode 165 through the first and second contact holes 171 and 172.

The array substrate having the above construction can be fabricated by a photolithography process using five masks, where each process may include rinsing the substrate, coating a photoresist film, developing the exposed photoresist film and etching an exposed layer without the photoresist film.

Accordingly, if one photolithography process is omitted, the overall fabrication time is reduced to a considerable degree and the total fabrication cost can be decreased. Also, a substrate failure rate decreases. Therefore, it is preferable that the number of masks used be decreased during the fabrication of the array substrate.

BRIEF SUMMARY

Accordingly, the present disclosure is directed to an array substrate for liquid crystal display (LCD) device and a fabrication method thereof that may obviate one or more problems due to limitations and disadvantages of the related art.

Herein is provided an array substrate for a liquid crystal display device including: a gate line formed on a substrate, and a gate electrode extending from the gate line; a data line intersected with the gate line, wherein the data line is configured with a gate insulating layer, a semiconductor layer and a data metal layer; a pixel electrode formed of a first transparent metal layer at a pixel which is defined by an intersection of the gate line and the data line; a source electrode extending from the data line, and a drain electrode spaced apart from the source electrode by a predetermined distance to expose a channel; and a second transparent metal layer pattern formed on the data line, the source electrode and the drain electrode, wherein the second transparent metal layer connects the drain electrode and the pixel electrode to each other.

In another aspect of the present invention, there is provided a method for fabricating an array substrate for a liquid crystal display device, including: forming a gate line configured with a first transparent metal layer, a first gate metal layer and a second gate metal layer stacked in sequence, a gate electrode extending from the gate line, and a pixel electrode formed of the first transparent metal layer; depositing a gate insulating layer, a semiconductor layer and a data metal layer on the substrate; patterning the gate insulating layer, the semiconductor layer and the data metal layer to form a data line intersected with the gate line, and source and drain electrodes extending from the data line, wherein the source and drain electrodes are connected to each other over the gate electrode; forming a second transparent metal layer on the substrate;

patterning the second metal layer to form a second transparent metal layer pattern on the data line, the source electrode, the drain electrode and a portion of the pixel electrode; and etching the data metal layer using the second transparent metal layer as a mask to expose the semiconductor layer between the source and drain electrodes.

In a further another aspect of the present invention, there is provided an array substrate for a liquid crystal display device including: a gate line formed on a substrate, and a gate electrode extending from the gate line; a common line formed in parallel to the gate line, and a plurality of common electrodes branched off from the common line; a data line intersected with the gate line, wherein the data line is formed from a data metal layer on a stacked pattern of a gate insulating layer and a semiconductor layer; a plurality of pixel electrodes formed from a first transparent metal layer at a pixel which is defined by an intersection of the gate line and the data line, wherein the plurality of pixel electrodes and the common electrodes are alternately formed; a source electrode extending from the data line, and a drain electrode spaced apart from the source electrode by a predetermined distance to expose a channel; and a second transparent metal layer pattern formed on the data line, the source electrode and the drain electrode, wherein the second transparent metal layer connects the drain electrode and the plurality of pixel electrodes to each other.

In a still further another aspect of the present invention, there is provided A method for fabricating an array substrate for a liquid crystal display device, including: forming a gate line configured with a first transparent metal layer, a first gate metal layer and a second gate metal layer stacked in sequence, a gate electrode extending from the gate line, a common line formed in parallel to the gate line, a plurality of common electrodes branched off from the common line, and a plurality of pixel electrodes formed from the first transparent metal layer, the plurality of pixel electrodes and the common electrodes being alternately formed; continuously depositing a gate insulating layer, a semiconductor layer and a data metal layer on the substrate; patterning the gate insulating layer, the semiconductor layer and the data metal layer to form a data line intersected with the gate line, and source and drain electrodes extending from the data line, wherein the source and drain electrodes are connected to each other over the gate electrode; forming a second transparent metal layer on the substrate; patterning the second metal layer to form a second transparent metal layer pattern on the data line, the source electrode, the drain electrode and portions of the plurality of pixel electrodes; and etching the data metal layer using the second transparent metal layer as a mask to expose the semiconductor layer between the source and drain electrodes.

Because the LCD device can be fabricated using only three mask processes according the present disclosure, the fabrication process is simplified and the number of masks decreases. Accordingly, it may be possible to reduce fabrication cost significantly as well as improve product yield.

In addition, it may be possible to prevent a lifting phenomenon of the transparent conductive material caused by spraying the wet etching solution at an angle when patterning the transparent conductive material layer for contacting the drain electrode and the pixel electrode with each other. Thus, pixel defects may be prevented and the reliability of the product may be improved.

Furthermore, the present method may be applied to an array substrate for an IPS mode LCD device in which the common electrode and the pixel electrode are formed together on the array substrate, thereby simplifying the fabrication process and reducing the fabrication cost.

Moreover, the channel protective layer of the TFT may be formed so as to prevent channel defects and improve the image quality.

Additionally, the protective layer for the array substrate may not be formed in an additional step, but rather may be formed when forming the channel protective layer.

It is to be understood that both the foregoing general description and the following detailed description are exemplary and explanatory and are intended to provide further explanation of the invention as claimed.

DETAILED DESCRIPTION OF THE DRAWINGS AND THE PRESENTLY PREFERRED EMBODIMENTS

Reference will now be made in detail to preferred embodiments, examples of which are illustrated in the accompanying drawings. Wherever possible, the same reference numbers will be used throughout the drawings to refer to the same or like parts.

Figure 3:
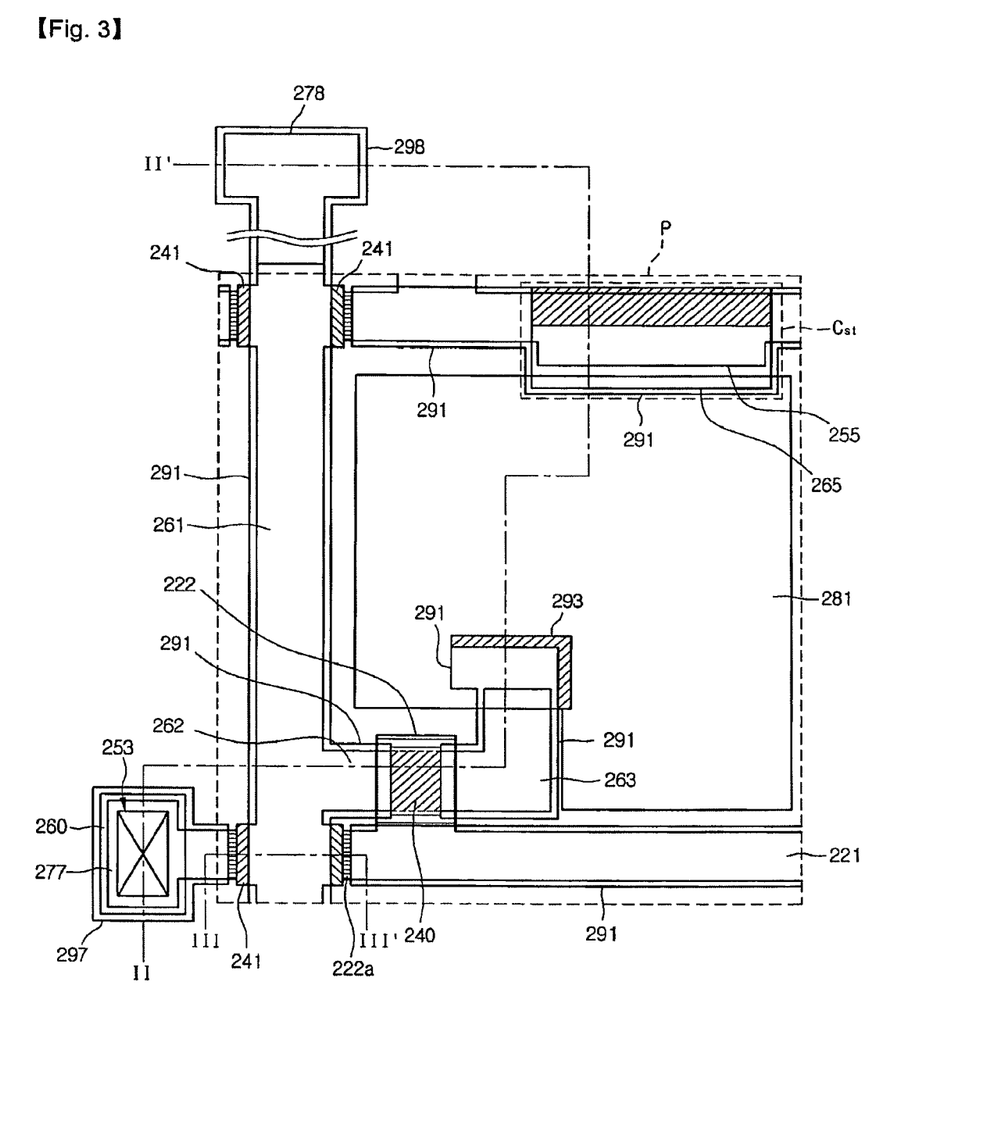
FIG. 3 is a plan view of an LCD device according to the present disclosure.
Figure 4:
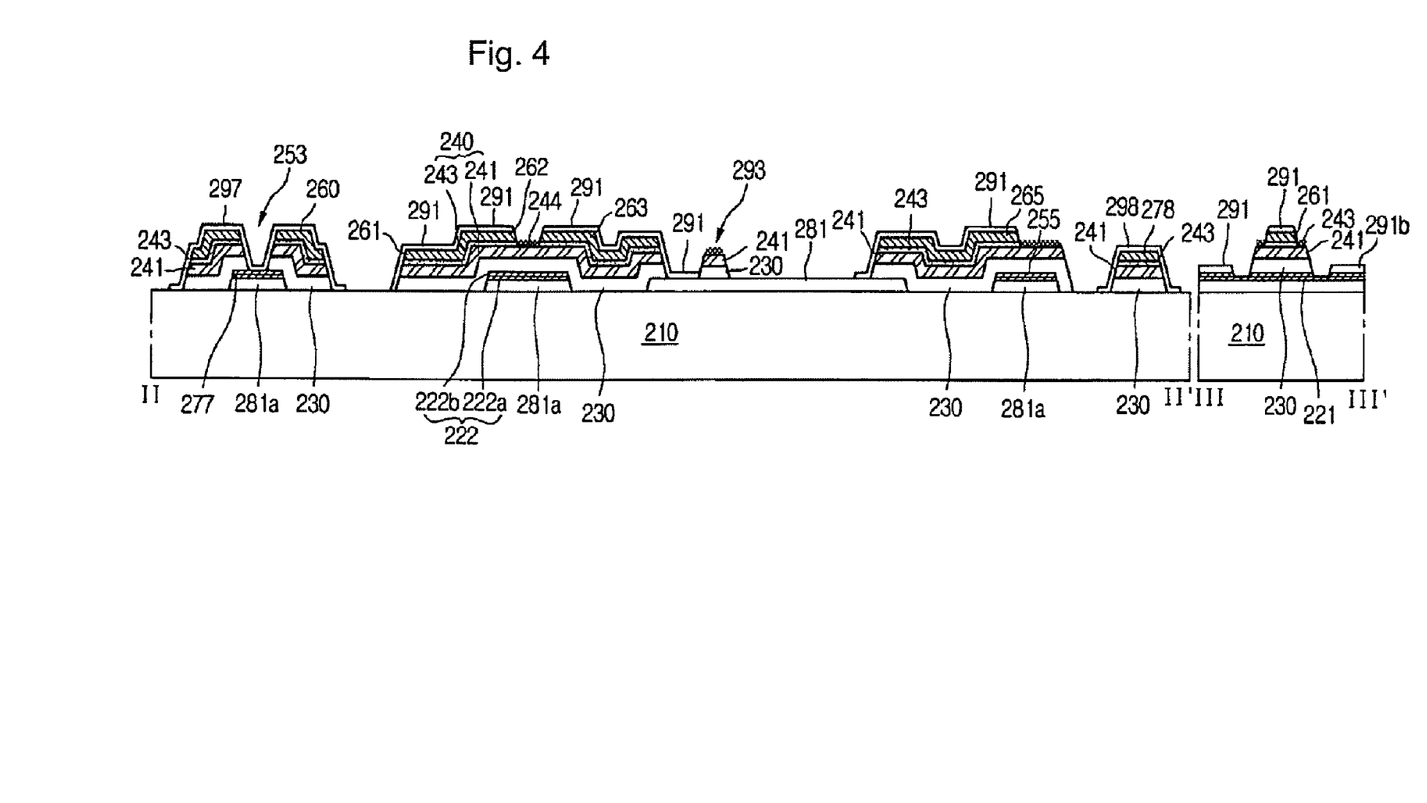
FIG. 4 are sectional views taken along the lines II-II' and III-III' of FIG. 1, respectively.

FIG. 3 is a plan view of an LCD device, and FIG. 4 includes sectional views taken along the lines II-II' and III-III' of FIG. 1, respectively.

Referring to FIGS. 3 and 4, the array substrate for an LCD includes a transparent insulating substrate 210, a gate line 221 formed on the transparent insulating substrate 210 in a horizontal direction, and a gate electrode 222 extending from the gate line 221.

A pixel electrode 281 is formed on a layer where the gate line 221 is formed.

Herein, each of the gate line 221 and the gate electrode 222 is formed by stacking first and second gate metal layers 222a and 222b on a first transparent metal layer 281a.

Each of the gate line 221 and the gate electrode 222 may be configured as a dual line or triple line structure having a low resistance metal for reducing a line resistance and a barrier metal for protecting the low resistance metal.

Here, each of the gate line 221 and the gate electrode 222 has a stacked structure of the first and second gate metal layers 222a and 222b. Each of the first and second gate metal layers 222a and 222b is formed of a metallic material selected from the group consisting of copper (Cu), aluminum (Al), an aluminum alloy such as aluminum neodymium (AlNd), molybdenum (Mo), chromium (Cr), titanium (Ti), tantalum (Ta), molybdenum-tungsten (MoW), and alloys thereof. For instance, the first gate metal layer 222a may be formed of a low resistance metal such as AlNd or the like, and the second gate metal layer 222b may be formed of a barrier metal such as Mo or the like.

The pixel electrode 281 is formed of the same transparent conductive material identical to the first transparent metal layer 281a.

The first transparent metal layer 281a may be formed of a transparent conductive material with excellent light transmittance such as indium-tin oxide (ITO), indium-zinc oxide (IZO), or the like.

A gate pad 277 is formed such that it extends from the gate line 221.

The gate pad 277 is formed by forming the gate metal layer 222 having the stacked structure on the first transparent metal layer 281a. The gate pad 277 is formed in the shape of an island, wherein first and second semiconductor layers 241 and 243 and a data metal layer 260 are stacked on the gate pad 277 with a gate insulating layer 230 interposed therebetween. The semiconductor layers 241 and 243 and the data metal layers 260 have a gate pad contact hole 253 exposing the first gate metal layer 222a.

The semiconductor layers 241 and 243 and the data metal layer 260 are in contact with a gate pad upper electrode 297 which is in contact with the gate pad 277 through the gate pad contact hole 253.

Herein, the semiconductor layer 240 is configured as a stack in sequence of the first semiconductor layer 241, which is formed of amorphous silicon (a-Si), and the second semiconductor layer 243, into which dopant ions are implanted.

A data line 261 is formed on the substrate 210 such that it is intersected with the gate line 221 to define a pixel region P. A source electrode 262 extending from the data line 261 and a drain electrode 263 are spaced apart from each other over the gate electrode 222.

The second semiconductor layer 243 between the source electrode 262 and the drain electrode 263 is removed so that the first semiconductor layer 241 is exposed to thereby form a channel. On the channel, the first semiconductor layer 241 is plasma-treated so as to form a channel protective layer 244.

The first semiconductor layer 241 is formed of amorphous silicon, and the second semiconductor layer 243 is formed of doped silicon.

A capacitor upper electrode 265 is overlapped with a capacitor lower electrode 255 provided in the gate line 221, wherein the gate insulating layer 230 is interposed between the capacitor upper and lower electrodes 265 and 255.

Thus, a storage capacitor is formed such that it includes the capacitor upper electrode 265, the capacitor lower electrode 255 extending from the gate line 221, and the gate insulating layer 230 interposed therebetween. That is, between the capacitor upper electrode 265 and the capacitor lower electrode 255 to which different voltages are applied, a dielectric, i.e., the gate insulating layer 230, is interposed, thereby forming the storage capacitor.

The data line 261 extends in a predetermined direction to form a data pad 278 at an edge of the substrate 210, and a data pad upper electrode 298 is formed on the data pad 278.

Here, the data line 261, the data pad 278, and the capacitor upper electrode 265 are formed by stacking the gate insulating layer 230, the first semiconductor layer 241, the second semiconductor layer 243, and the data metal layer 260 on the substrate 210 in sequence.

The data metal layer 260 may be formed of a metallic material selected from the group consisting of Cu, Al, an aluminum alloy such as AlNd, Mo, Cr, Ti, Ta and MoW.

It is preferable that the metal for the first gate metal layer 222a should have a different etch selectivity than the metal for the data metal layer 260.

Meanwhile, a second transparent metal layer 291 is formed on the data line 261, the source electrode 262, and the drain electrode 263 facing the source electrode 262, wherein the second transparent metal layer 291 on the drain electrode 263 is spaced apart from the second transparent metal layer 291 on the source electrode 262.

The second transparent metal layer 291 may be formed of transparent conductive material with excellent light transmittance such as indium-tin-oxide (ITO), indium-zinc-oxide (IZO).

The second transparent metal layer 291 formed on the drain electrode 263 extends to the pixel electrode 281 so that the drain electrode 263 and the pixel electrode 281 are in contact with each other.

The second transparent metal layer 291 is formed such that it is directly in contact with the data line 261, the source electrode 262, and the drain electrode 263.

The second transparent metal layer 291 may be formed on the gate line 221, and it is directly in contact with the gate line 221.

In order to prevent the second transparent metal layer 291 formed on the gate line 221 from being connected to the second transparent metal layer 291 formed on the data line 261, a portion of the second transparent metal layer 291 on the gate line 221 is cut away to form a cut portion at a region where the gate line 221 and the data line 261 are intersected with each other.

Thus, the first gate metal layer 222a of the gate line 221 is partially exposed through the cut portion.

Meanwhile, an electrical short may occur if a mask for patterning the second transparent metal layer 291 on the gate line 221 and the data line 261 is misaligned. Thus, in order to prevent the electrical short, the first semiconductor layer 241 may be partially exposed such that it protrudes from the data line 261 to either side of the gate line 221.

Besides having the first semiconductor layer 241 protrude from the data line 261 toward the gate line 221, the second transparent metal layer 291 on the data line 261 may be formed such that it has a smaller width at the intersection of the data line 261 and the gate line 221 than along the data line 261, as can be seen in FIG. 3. Thus, the first semiconductor layer 241 is partially exposed so that it is possible to prevent an electrical short between the gate line 221 and the data line 261.

The second transparent metal layer 291 is also formed on the gate pad 277 extending from the gate line 221, which forms the gate pad upper electrode 297 as described above.

The second transparent metal layer 291 is also formed on the data pad 278 extending from the data line 261, which forms the data pad upper electrode 298, as described above.

The second transparent metal layer 291 is also formed on the capacitor upper electrode 265. Therefore, the second transparent metal layer 291 on the capacitor upper electrode 265 extends to the pixel electrode 281 and thus it is in contact with the pixel electrode 281 such that it can receive a signal therefrom.

In order that the drain electrode 263 and the pixel electrode 261 may be electrically connected to each other, a partition wall 293 is formed around the second transparent metal layer 291 which extends from the drain electrode 263 to the pixel electrode 281.

The partition wall 293 may be formed by stacking the gate insulating layer 230 and the first semiconductor layer 241.

From a plan view perspective, as shown in FIG. 3, the partition wall 293 may have the shape of a bar, a Greek alphabet symbol Γ, an alphabet L, a three-sided square, etc.

The partition wall 293 may have angled corners or rounded corners.

The partition wall 293 may play a role in preventing defects caused by lifting of the second transparent metal layer 291 during a wet-etching process used in patterning the second transparent metal layer 291.

Therefore, the partition wall 293 is formed adjacent to the second transparent metal layer 291 such that it can prevent or inhibit the lifting phenomenon of the corners of the second transparent metal layer 291 due to the etching solution.

Thereinafter, a method for fabricating the array substrate for the LCD device according to the present disclosure will be illustrated with reference to accompanying drawings.

FIGS. 5A to 5E are sectional views illustrating a method for fabricating the array substrate of the LCD device according. FIGS. 5A to 5E show respective portions corresponding to sectional views taken along the lines II-II' and III-III' of FIG. 3.

Figure 5A:
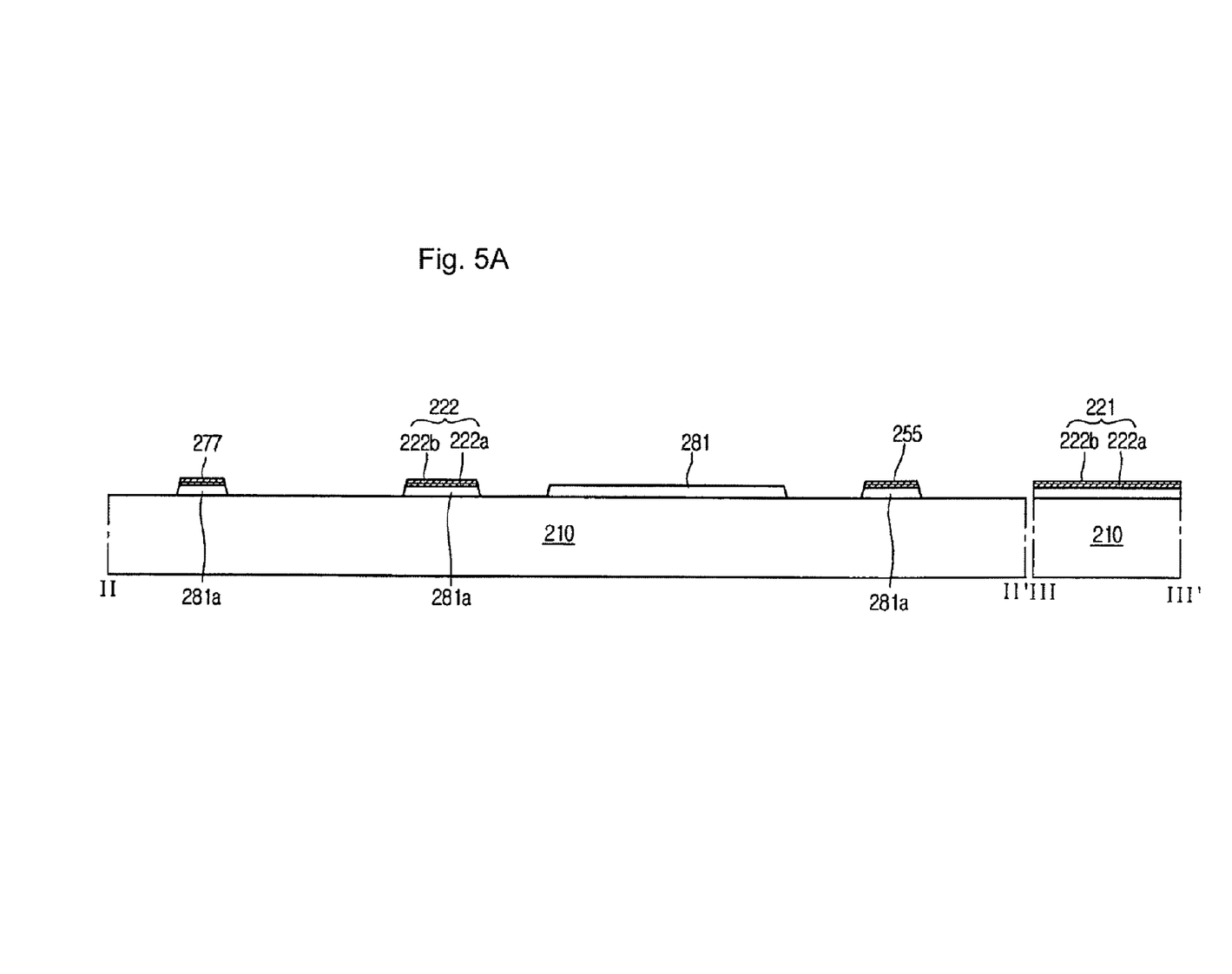
FIGS. 5A to 5E are sectional views illustrating a method for fabricating the array substrate of the LCD device according to the present disclosure.

Referring to FIG. 5A, a first transparent metal layer 281a formed of a transparent conductive material, a first gate metal layer 222a and a second gate metal layer 222b are sequentially formed on a substrate 210 using a first mask process. Thereafter, the first transparent metal layer 281a, and the first and second gate metal layers 222a and 222b are patterned so as to form a gate line 221 and a gate electrode 222, wherein each of the gate line 221 and the gate electrode 222 includes the first transparent metal layer 281a and the first and second gate metal layers 222a and 222b, which are stacked in sequence. The first and second gate metal layers 222a and 222b formed on a predetermined region of the substrate 210 are removed so as to form a pixel electrode 281.

The transparent conductive material may be selected from the group consisting of indium-tin oxide (ITO), indium-zinc oxide (IZO) and indium-tin-zinc oxide (ITZO).

The first and second gate metal layers 222a and 222b are formed by continuously depositing metallic material selected from the group consisting of Cu, Al, an aluminum alloy such as AlNd, Mo, Cr, Ti, Ta, MoW, and alloys thereof.

The first gate metal layer 222a may be formed of low resistance metal among the above-listed metallic materials, e.g., an aluminum alloy.

The second gate metal layer 222b may be formed of a barrier metal such as Mo or the like that can protect the first gate metal layer 222a.

Although the first mask process is not illustrated in the drawings, detailed descriptions will be set forth below.

To begin with, the first mask process is performed using a diffraction mask or a half-tone mask. After forming a first photoresist layer on the substrate 210 where the first transparent metal layer 281a and the first and second gate metal layers 222a and 222b are sequentially stacked, the diffraction mask or the half-tone mask is aligned over the substrate 210.

The half-tone mask includes a transmissive region where the light is completely transmitted, a blocking region where the light is completely blocked, and a transflective region where the light is partially transmitted. The diffraction mask includes a diffraction region where the light is partially transmitted using the principle of light diffraction occurring while passing through diffraction gratings, instead of a translucent region.

Therefore, the first photoresist layer is exposed and developed using the diffraction mask or the half-tone mask so as to form a first photoresist pattern having a step.

The first transparent metal layer 281a and the first and second gate metal layers 222a and 222b are patterned by an etching process using the first photoresist pattern as a mask, thereby forming the gate line 221 having the first transparent metal layer 281a and the gate metal layers 222a and 222b stacked thereon, the gate electrode 222, the gate pad 277, and the pixel electrode 281 formed by the removal of the gate metal layers 222a and 222b.

Here, a portion of the gate line 221 is formed as a capacitor lower electrode 255.

Figure 5B:
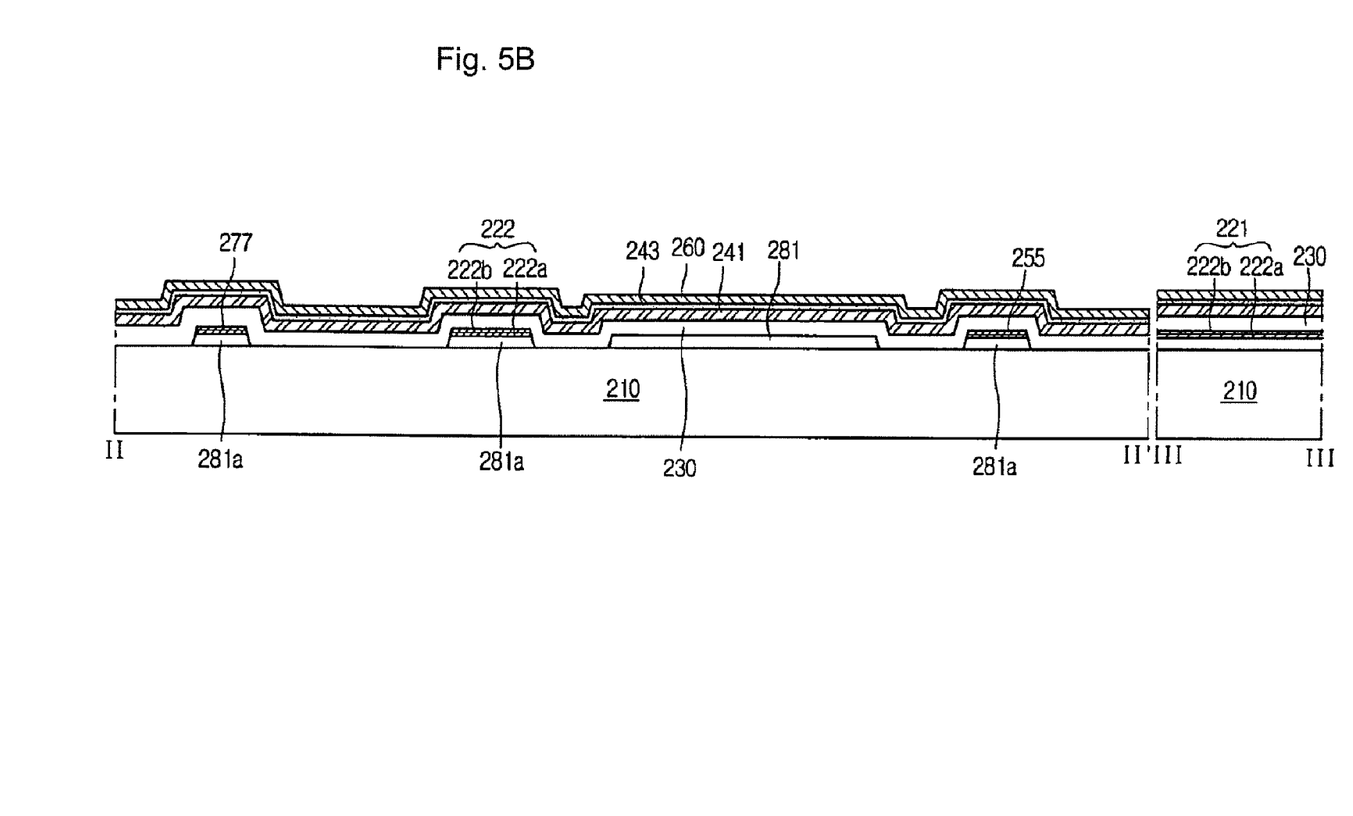

Subsequently, referring to FIG. 5B, a gate insulating layer 230, a first semiconductor layer 241, a second semiconductor layer 243, a data metal layer 260 are sequentially formed on the substrate 210 where the gate line 221 and the pixel electrode 281 are formed.

Here, the first semiconductor layer 241 is formed of amorphous silicon, and the second semiconductor layer 243 is formed of a silicon layer into which dopant ions are implanted.

Figure 5C:
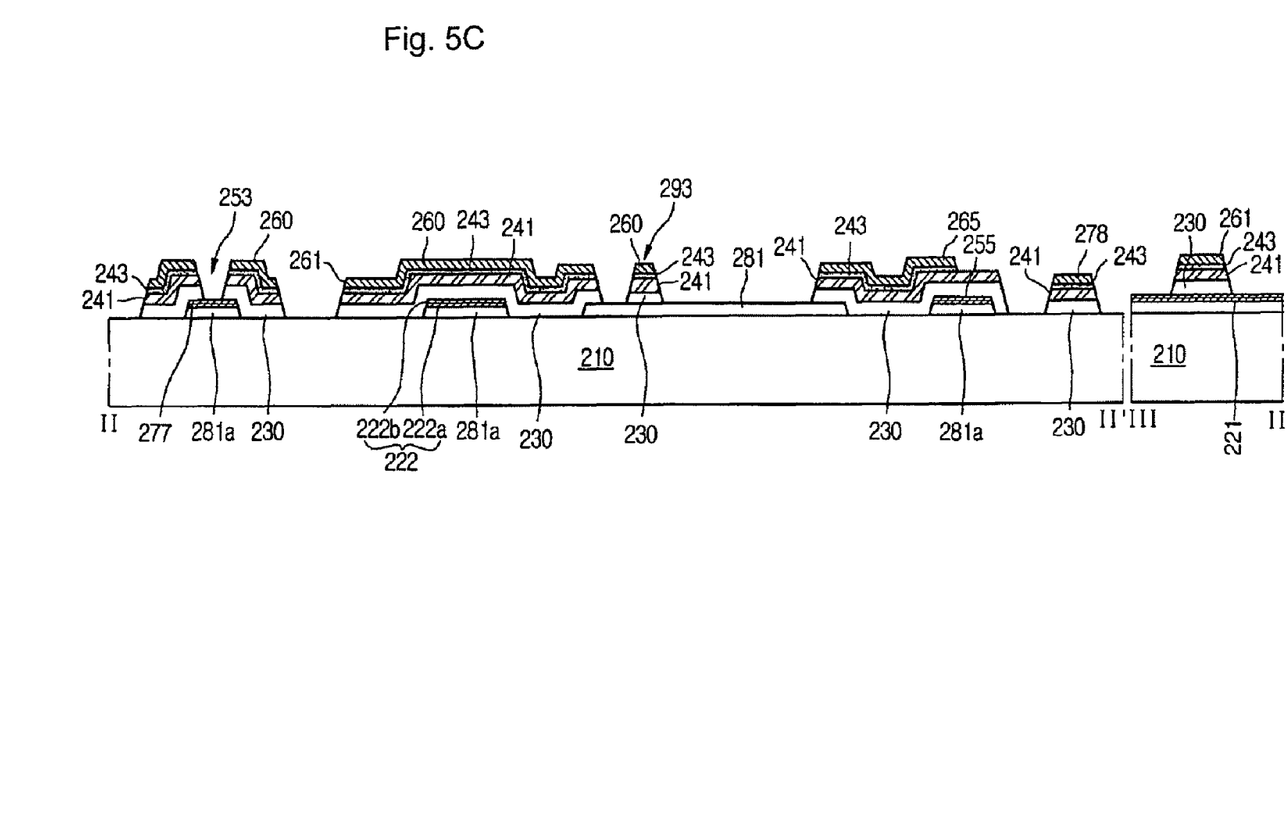

Referring to FIG. 5C, the first and second semiconductor layers 241 and 243, and the data metal layer 260 are patterned using a second mask process.

A second photoresist pattern is formed on the substrate 210 where the gate insulating layer 230, the first and second semiconductor layers 241, 243 and the data metal layer 260 are formed.

The gate insulating layer 230, the first and semiconductor layers 241 and 243, and the data metal layer 260 are patterned using the second photoresist pattern, thereby forming a data line 261 crossing over the gate line 221, the source electrode and drain electrodes (not spaced apart from each other) extending from the data line 261, the capacitor upper electrode 265 formed on portions of the gate line 221 and the pixel electrode 281, the data pad 278 formed at one end of the data line 261, and a gate pad contact hole 253. Herein, the gate insulating layer 230, the first and second semiconductor layers 241 and 243, and the data metal layer 260 are patterned using the second mask pattern to thereby form the gate pad contact hole 253 exposing a portion of the gate pad 277 in the shape of an island.

The data line 261 may have portions which protrude toward the gate line at the region where the data line is intersected with the gate line.

Thus, it may be possible to prevent an electrical short due to misalignment of the mask when patterning a second transparent metal layer.

Near a thin film transistor region on the pixel electrode 281, the partition wall 293 with a predetermined shape is formed, wherein the partition wall 293 is configured with the gate insulating layer 230, the first and second semiconductor layers 241 and 243, the data metal layer pattern 260.

From a plan view perspective, the partition wall 293 may have the shape of a bar, a Greek alphabet symbol Γ, an alphabet L a three-sided square, etc., which enhances electrical contact between the drain electrode 263 and the pixel electrode 281.

Meanwhile, the gate insulating layer 230, the first and second semiconductor layers 241 and 243, and the data metal layer 260 are patterned through blanket etching so that portions of the pixel electrode 281, the gate line 221 and the substrate 210 may be exposed.

Figure 5D:
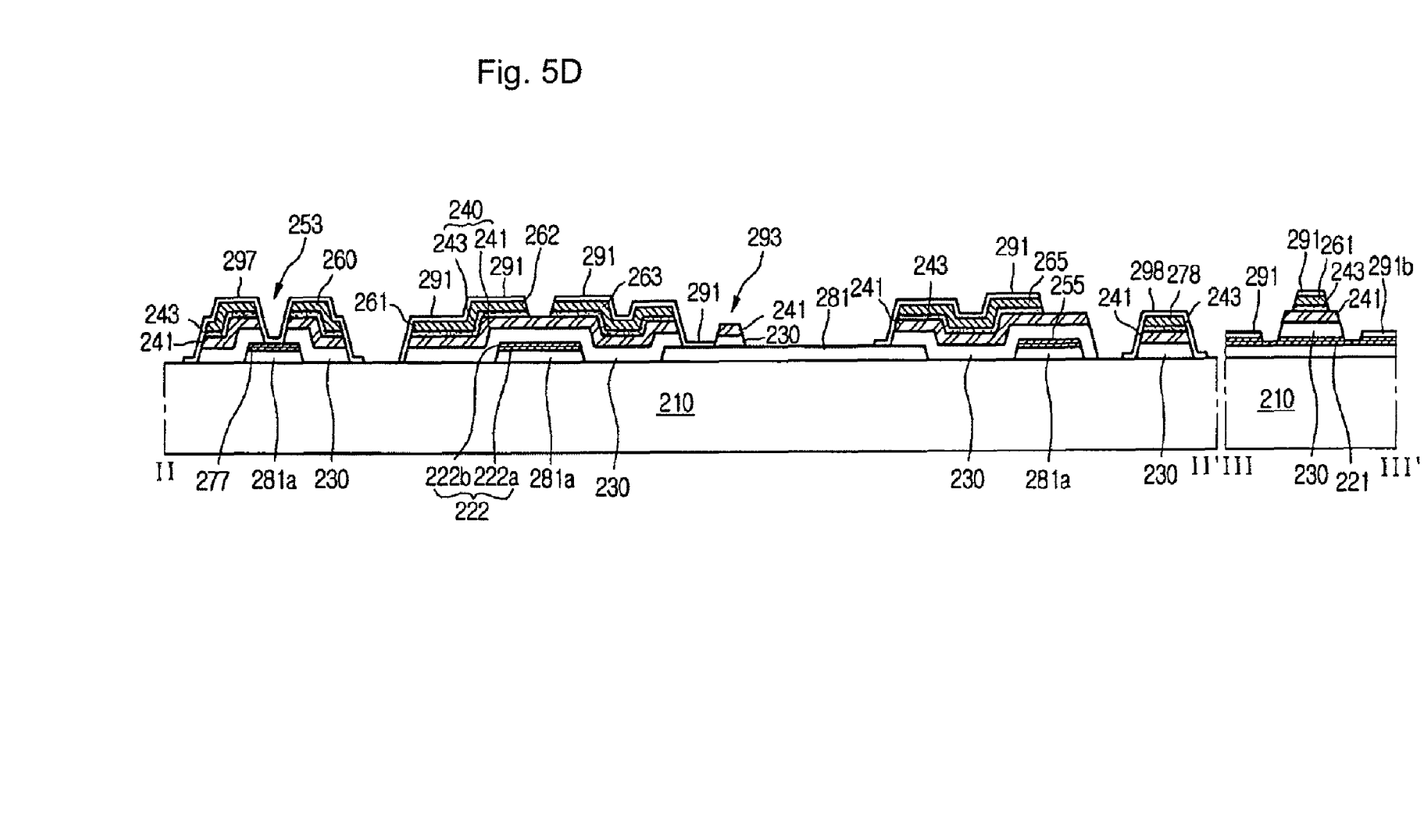

Thereafter, referring to FIG. 5D, a second transparent metal layer 291 is formed on substantially the entire surface of the substrate 210, wherein the second transparent metal layer 291 is formed of transparent conductive material. Afterwards, a third photoresist layer is formed on the second transparent metal layer 291 and then patterned into a predetermined shape using a third mask process. Subsequently, the second transparent metal layer is patterned into a desired configuration using the patterned third photoresist layer.

The second transparent metal layer 291 is formed of material selected from the group consisting of indium-tin oxide (ITO), indium-zinc oxide (IZO) and indium-tin-zinc oxide (ITZO).

The second transparent metal layer 291 is in contact with the data line 261, and extends to the data pad 278 formed at one end of the data line 261 to thereby form the data pad upper electrode 298.

The second transparent metal layer 291 is also in contact with the gate line 221. In addition, the second transparent metal layer 291 has a cut portion that exposes a portion of the gate line 221 at a region where the gate line 221 and the data line 261 are intersected with each other. Therefore, it is possible to prevent an electrical short between the gate line 221 and the data line 261.

The second transparent metal layer 291 is formed such that it extends to the gate pad 277 formed at one end of the gate line 221, and the second transparent metal layer 291 as the gate pad upper electrode 297 is in contact with the gate pad 277 through the gate pad contact hole 253.

Furthermore, the second transparent metal layer 291 is also formed on the source electrode 262 and the drain electrode 263 extending from the data line 261, which are not spaced apart from each other. Here, the second transparent metal layer 291 on the source electrode 262 is spaced apart from the second transparent metal layer 291 on the drain electrode 263 so as to provide a channel region.

The second transparent metal layer 291 formed on the drain electrode 263 extends to the pixel electrode 281, wherein the partition wall 293 is formed in the vicinity thereof.

Accordingly, the second transparent metal layer 291 is not only in contact with the drain electrode 263 directly but is also in contact with the pixel electrode 281 directly. Thus, it is possible to transfer a signal without an additional contact hole.

The second transparent metal layer 291 is formed to be directly in contact with the capacitor upper electrode 265, and the second transparent metal layer 291 extends to the pixel electrode 281 so that the signal of the pixel electrode 281 can be applied to the second transparent metal layer 291 and the capacitor upper electrode 265.

The second transparent metal layer 291 is not formed on the pixel electrode 281, and the first transparent metal layer 281a constituting the pixel electrode 281 is not etched during the etching process of the second transparent metal layer 291.

The reason is that the etching property of the first transparent metal layer 281a becomes different from that of the second transparent metal layer 291 even though they are formed of the same material. In detail, the first transparent metal layer 281a undergoes a follow-up high temperature process after the patterning process thereof. Accordingly, the first transparent metal layer 281a is polycrystallized so that the etching property is different from that of the second transparent metal layer 291. Thus, the first transparent metal layer 281a is not etched even if using the etching solution for etching the second transparent metal layer 291.

Meanwhile, the second transparent metal layer 291 is patterned by a wet etching process. As one type of wet etching process, the etching solution may be sprayed from nozzles while moving the substrate in one direction during the etching process.

Since the etching solution is sprayed in the preferred direction according to the movement of the substrate, a problem may occur that the corners of the second metal layer 291 are lifted with respect to the spraying direction. The second transparent metal layer 291, which is formed as small patterns for electrically connecting the drain electrode 263 and the pixel electrode 281 to each other, is lifted so that fatal defects are caused in the pixel. However, according to the present disclosure, due to the partition wall 293, it is possible to prevent the lifting of the second transparent metal layer 291 caused by the etching solution.

After patterning the second transparent metal layer 291, a channel layer is formed using the pattern of the second transparent metal layer 291 as a mask.

Specifically, the gate insulating layer 230, the first and second semiconductor layers 241 and 243, the data metal layer 260 are continuously deposited on the TFT region to which the source and drain electrodes 262 and 263 are connected. On the source and drain electrodes 262 and 263, the second transparent metal layers 291 are formed such that they are spaced apart from each other by a predetermined distance. Therefore, the metal layer 260 and the second semiconductor layer 243 are etched using the second transparent metal layer 291 as a mask to form the channel region.

Accordingly, the first gate metal layer 222a exposed by the cut portion of the second transparent metal layer 291 formed on the gate line 221 is etched so that the second gate metal layer 222b may be exposed.

The second gate metal layer 222b is not etched during the etching of the data metal layer 260 because they have different etching properties from each other.

Meanwhile, the second transparent metal layer 291 is not formed over the portions that protrude from the data line 261 toward the gate line 221. Thus, the data metal layer 260 and the second semiconductor layer 243 are etched using the protruded portions as masks to expose the first semiconductor layer 241.

The data line 262 protrudes from the data line 261 toward the gate line 221, and the second transparent metal layer 291 on the data line 261 may be formed such that it has a smaller width at the intersection of the data line 261 and the gate line 221 than the width of the second transparent metal layer 291 along the data line 261. Thus, the first semiconductor layer 241 is partially exposed so that it is possible to prevent an electrical short between the gate line 221 and the data line 261.

Figure 5E:
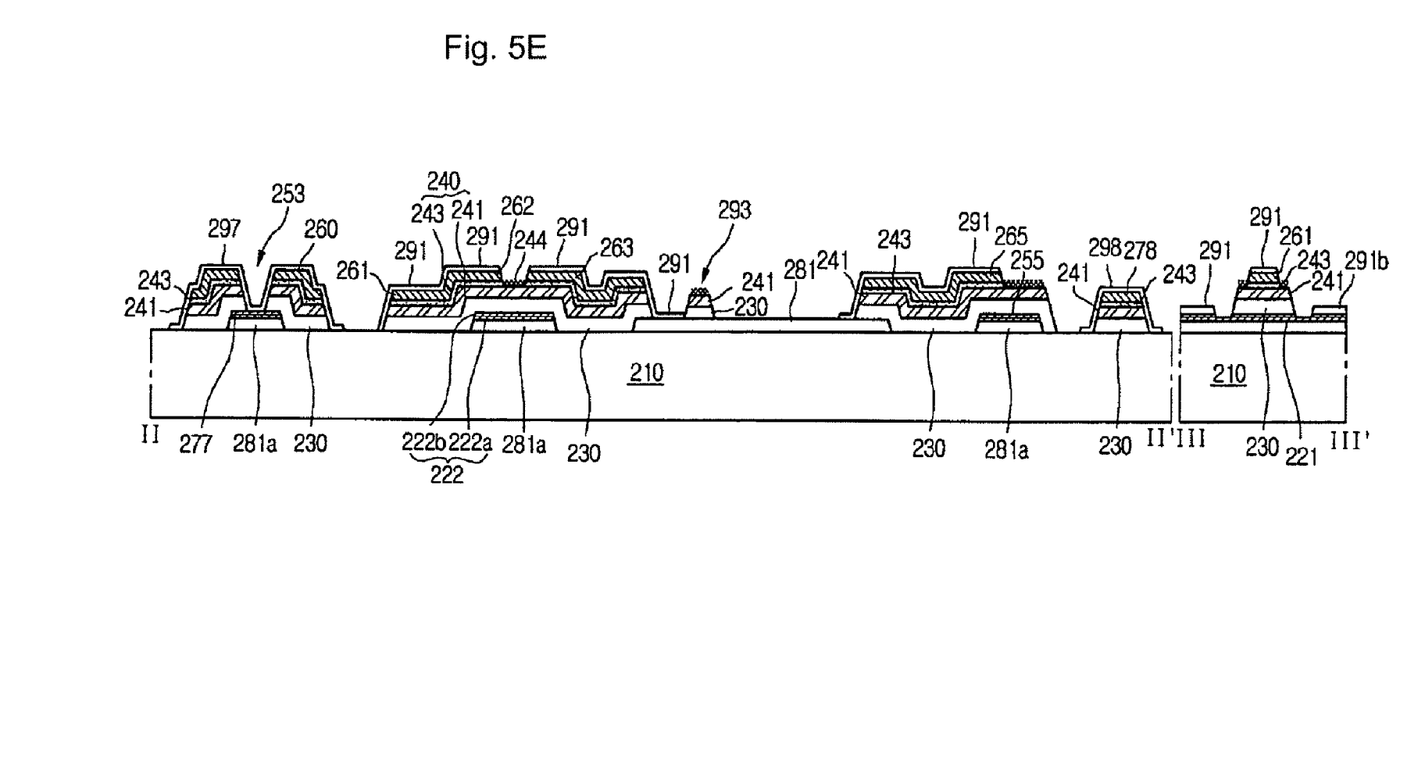

Finally, referring to FIG. 5E, plasma treatment is performed on the substrate 210. Here, the surface of the first semiconductor layer 241 exposed by the channel is exposed to $O_x$ plasma such as $O_2$ plasma or $N_x$ plasma (e.g., $N_2$ plasma) so that ionic $O_x$ or $N_x$ reacts with silicon (Si) contained in the semiconductor layer 240. Thus, a channel protective layer 244 is formed of one of $SiO_2$ and $SiN_x$ on the first semiconductor layer 241.

The channel protective layer 244 prevents or inhibits damage to the channel.

In addition, the channel protective layer 244 may help prevent defects in the product and enhance image quality.

In the present disclosure, because the protective layer of the array substrate is not formed in an additional step, but rather is formed by forming the oxide layer or nitride layer of the channel protective layer, additional equipment and materials are not required. In addition, the manufacturing cost can be reduced so that a thin LCD device can be embodied.

As described above, the array substrate for the LCD device according to the present disclosure may be formed through three mask processes. Since the mask process accompanies various processes of coating, exposing and developing and etching the photoresist layer, the method reduces the number of mask processes so that it is possible to improve the product yield. In addition, it is possible to reduce the manufacturing cost significantly and the defect ratio.

Figure 6:
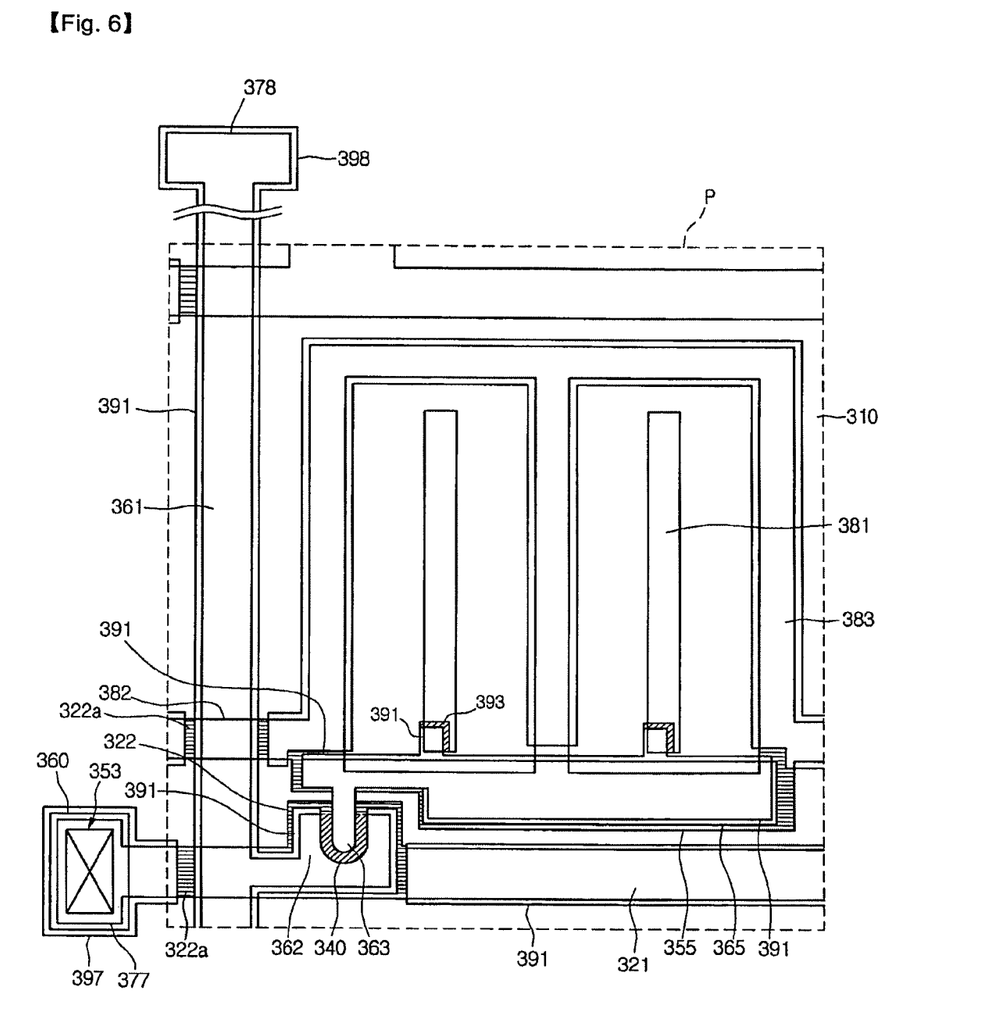
FIG. 6 is a plan view of an in-plane switching (IPS) mode LCD device according to the present disclosure.

FIG. 6 is a plan view of an in-plane switching (IPS) mode LCD device.

Herein, like reference numerals denote like elements of FIGS. 3 and 4.

Referring to FIG. 6, an array substrate 310 for an in-plane switching (IPS) LCD device includes a plurality of gate lines 321, a common line 382, and a data line 361. The plurality of gate lines 321 extending in a predetermined direction are spaced apart from each other by a predetermined distance, and are also disposed in parallel to each other. The common line 382 is adjacent to the gate line 321 and is arranged in the predetermined direction. The data line 361 is intersected with the gate line 321 and the common line 382, and particularly, the data line 361 and the gate line 321 are intersected with each other to define a pixel region P.

In the pixel region P, the common line is formed in parallel to the gate line 321, and a common electrode 383 is connected to the common line 382.

The common electrode 383 is configured with a plurality of vertical portions extending perpendicular to the common line 382, and a horizontal portion connecting the plurality of vertical portions.

The pixel electrodes 381 are formed in the shape of a vertical pattern alternately between the vertical portions of the common electrode 383.

The gate line 321, the common line 382, and the common electrode 383 may be formed by continuously depositing a first transparent metal layer, a first gate metal layer 322a, and a second gate metal layer on the substrate. The pixel electrode 381 may be formed from the first transparent metal layer. That is, the pixel electrode 381 may be formed through a diffraction process using a first mask.

A gate insulating layer, a semiconductor layer 340, and a data metal layer 360 are sequentially stacked on the substrate 310 where the gate line 321, the common line 382, the common electrode 383 and the pixel electrode 381 are formed. Thereafter, the gate insulating layer, the semiconductor layer 340 and the data metal layer 360 are patterned by a blanket etching process through a second mask process, thereby forming the data line 361 intersected with the gate line 321, source and drain electrodes 362 and 363 extending from the data line 361, and a capacitor upper electrode 365 extending from the drain electrode 363. Here, the capacitor upper electrode 365 is formed on the capacitor lower electrode 355, wherein the gate insulating layer is interposed therebetween.

Herein, the data line 361, the pixel electrode 381, and the common electrode 383 may be formed in a zigzag shape having one or more inflection points.

The data line 361 extends in a predetermined direction so as to form the data pad 378. The gate insulating layer, the first and second semiconductor layers, and the data metal layer pattern 360 are formed in the shape of an island, and a gate pad contact hole 353 is formed to expose a portion of the gate pad 377.

Subsequently, a pattern of the second transparent metal layer 391 is formed on the substrate 310 through a third mask process.

The second transparent metal layer 391 is formed such that it is directly in contact with the data line 361 and the data pad 378, and the second transparent metal layer 391 is also formed to be directly in contact with the gate line 321 and the gate pad 377.

In order to prevent the second transparent metal layer 391 formed on the gate line 321 from being electrically connected to the second transparent metal layer 391 formed on the data line 361, a portion of the second transparent metal layer 391 on the gate line 321 is cut away at a region where the gate line 321 and the data line 361 are intersected with each other, to thereby form a cut portion.

Thus, the second gate metal layer 322b of the gate line 321 exposed by the cut portion is etched away so that the first gate metal layer 322a may be exposed.

In addition, the second transparent metal layer 391 is directly in contact the common line 382, and the second transparent metal layer 391 has a predetermined cut portion in order to prevent the electrical short to the second transparent metal layer 391 formed on the data line 361.

The common line 382 is formed such that second gate metal layer exposed by the cut portion is etched and the first gate metal layer 322a is exposed.

The second transparent metal layer may be formed on the common electrode 383. Alternatively, the second transparent metal layer 391 is not formed on the common electrode 383 but the second gate metal layer is etched to form the first gate metal layer 322a.

The second transparent metal layer 391 on the source electrode 362 is spaced apart from the second transparent metal layer 391 on the drain electrodes 363. A channel layer is formed between the source and drain electrodes 362 and 363. On the channel layer, there may be formed a channel protective layer formed of silicon nitride or silicon oxide.

The second transparent metal layer 391 extends to a plurality of vertical patterns of pixel electrodes 381 from the drain electrode 363 so that the pixel electrode 381 and the drain electrode 363 are electrically connected to each other.

In the vicinity of the second transparent metal layer 391 connecting the pixel electrode 381 to the drain electrode 363, a partition wall 393 is formed, which is configured with the gate insulating layer and the semiconductor layer 340.

The partition wall 393 may be formed in the shape of a bar, a Greek alphabet symbol Γ, a three-sided square, etc. The partition wall 393 plays a role in preventing contact defects caused by the lifting of the second transparent metal layer pattern in the wet-etching direction when patterning the second transparent metal layer 391.

The second transparent metal layer 391 is formed on the capacitor upper electrode 365, too.

Further, the second transparent metal layer 391 is formed as the gate pad upper electrode 397 on the gate pad 377 so that it is in contact with the gate pad contact hole 353.

The IPS mode LCD device having the above structure may be fabricated through three mask processes.

According to the present disclosure, the LCD device can provides several advantageous effects as below.

First, because the LCD device can be fabricated through only three mask processes, the fabrication process is simplified and the number of masks is decreased. Thus, it is possible to reduce fabrication cost substantially as well as improve product yield.

Second, it is possible to prevent the lifting phenomenon of the transparent conductive material caused by spraying the wet etching solution at an angle when patterning the transparent metal layer for contacting the drain electrode and the pixel electrode with each other. Thus, pixel defects can be prevented or inhibited so that it is possible to improve the product reliability.

Third, the present disclosure can be applied to an array substrate for an IPS mode LCD device in which the common electrode and the pixel electrode are formed together on the array substrate, thereby simplifying the fabrication process and reducing the fabrication cost.

Fourth, the channel protective layer of the TFT is formed so as to prevent channel defects and improve the image quality.

Fifth, the protective layer for the array substrate is not formed in an additional step, but it can be formed by forming the oxide layer when forming the channel protective layer. Therefore, additional equipment and materials are not required, and it is possible to reduce the material cost and obtain a thin LCD device.

It will be apparent to those skilled in the art that various modifications and variations can be made in the present disclosure. Thus, it is intended that the present disclosure covers the modifications and variations of this invention provided they come within the scope of the appended claims and their equivalents.

The invention claimed is:

1. An array substrate for a liquid crystal display device comprising:
   - a gate line disposed on a substrate, and a gate electrode extending from the gate line;
   - a data line crossing the gate line, wherein the data line includes a gate insulating layer, a semiconductor layer and a data metal layer;
   - a pixel electrode formed of a first transparent metal layer in a pixel region defined by a crossing of the gate line and the data line;
   - a source electrode extending from the data line, and a drain electrode spaced apart from the source electrode by a predetermined distance to expose a channel;
   - a second transparent metal layer pattern formed on the data line, the source electrode and the drain electrode, wherein the second transparent metal layer connects the drain electrode and the pixel electrode to each other; and
   - a partition wall formed in the vicinity of the second transparent metal layer on the pixel electrode, and wherein the partition wall comprises the gate insulating layer and the semiconductor layer which are stacked in sequence.

2. The array substrate according to claim 1, wherein the second transparent metal layer is formed on the gate line.

3. The array substrate according to claim 1, wherein the second transparent metal layer has a predetermined cut portion on the gate line.

4. The array substrate according to claim 1, further comprising a channel protective layer formed of silicon oxide or silicon nitride.

5. The array substrate according to claim 1, wherein the gate line and the gate electrode are formed by depositing the first transparent metal layer, the first gate metal layer and the second gate metal layer in sequence.

6. The array substrate according to claim 1, wherein a capacitor electrode is provided in a portion of the gate line, the capacitor electrode comprising:
   - a capacitor lower electrode configured as the gate line;
   - a gate insulating layer formed on the capacitor lower electrode as a dielectric; and
   - a capacitor upper electrode including the semiconductor layer, the data metal layer and the second transparent metal layer formed on the gate insulating layer.

7. The array substrate according to claim 1, wherein the semiconductor layer protrudes toward the gate line at a position where the data line is intersected with the gate line so as to expose the semiconductor layer.

8. The array substrate according to claim 1, wherein the partition wall is formed such that it has at least one shape selected from the group consisting of a bar shape, a Greek alphabet Γ shape, and a three-sided square shape.

9. The array substrate according to claim 1, further comprising a data pad formed at one end of the data line, wherein the data pad is directly in contact with the data line and the second transparent metal layer.

10. The array substrate according to claim 1, wherein the first transparent metal layer is formed of a transparent conductive material.

11. The array substrate according to claim 1, wherein the first and second transparent metal layers have different etching properties from each other.

12. The array substrate according to claim 1, wherein the first gate metal layer and the data metal layer have different etching properties from each other.

* * * * *